United States Patent
Sinclair et al.

(10) Patent No.: US 11,818,830 B2
(45) Date of Patent: Nov. 14, 2023

(54) RF QUADRUPOLE PARTICLE ACCELERATOR

(71) Applicant: Applied Materials, Inc., Santa Clara, CA (US)

(72) Inventors: Frank Sinclair, Boston, MA (US);
Wai-Ming Tam, Manchester-by-the-Sea, MA (US);
Costel Biloiu, Rockport, MA (US);
William Davis Lee, Rockport, ME (US)

(73) Assignee: Applied Materials, Inc., Santa Clara, CA (US)

( * ) Notice: Subject to any disclaimer, the term of this patent is extended or adjusted under 35 U.S.C. 154(b) by 254 days.

(21) Appl. No.: 17/163,251

(22) Filed: Jan. 29, 2021

(65) Prior Publication Data
US 2022/0248523 A1   Aug. 4, 2022

(51) Int. Cl.
| H05H 9/04 | (2006.01) |
| H01J 37/317 | (2006.01) |
| H05H 7/22 | (2006.01) |
| H05H 7/02 | (2006.01) |

(52) U.S. Cl.
CPC ........... *H05H 9/04* (2013.01); *H01J 37/3171* (2013.01); *H05H 7/02* (2013.01); *H05H 7/22* (2013.01); *H01J 2237/04732* (2013.01); *H05H 2007/222* (2013.01); *H05H 2007/227* (2013.01)

(58) Field of Classification Search
CPC ....................................................... H01J 37/32
See application file for complete search history.

(56) References Cited

U.S. PATENT DOCUMENTS

| 4,667,111 | A | * | 5/1987 | Glavish | H01J 37/3171 |
| | | | | | 315/505 |
| 4,712,042 | A | * | 12/1987 | Hamm | H05H 9/00 |
| | | | | | 315/5.46 |
| 6,153,880 | A | * | 11/2000 | Russ, IV | H01J 49/4215 |
| | | | | | 250/292 |
| 6,407,505 | B1 | * | 6/2002 | Bertsche | H05H 9/04 |
| | | | | | 315/5.46 |
| 6,777,893 | B1 | * | 8/2004 | Swenson | H05H 9/00 |
| | | | | | 315/505 |
| 6,855,942 | B2 | * | 2/2005 | Bechthold | H05H 7/08 |
| | | | | | 315/501 |
| 7,098,615 | B2 | * | 8/2006 | Swenson | H05H 9/00 |
| | | | | | 315/505 |

(Continued)

FOREIGN PATENT DOCUMENTS

EP   1056113 A2   11/2000

OTHER PUBLICATIONS

International Search Report and Written Opinion dated Apr. 12, 2022, for the International Patent Application No. PCT/US2021/063611, filed on Dec. 15, 2021, 8 pages.

*Primary Examiner* — Srinivas Sathiraju
(74) *Attorney, Agent, or Firm* — KDW Firm PLLC

(57) ABSTRACT

An apparatus may include a drift tube assembly, the drift tube assembly defining a triple gap configuration, and arranged to accelerate and transmit an ion beam along a beam path. The apparatus may include a resonator, to output an RF signal to the drift tube assembly, and an RF quadrupole triplet, connected to the drift tube assembly, and arranged circumferentially around the beam path.

16 Claims, 7 Drawing Sheets

(56) References Cited

U.S. PATENT DOCUMENTS

| | | | |
|---|---|---|---|
| 7,138,771 B2 * | 11/2006 | Bechthold | H05H 7/04 |
| | | | 315/505 |
| 10,362,666 B2 | 7/2019 | Mustapha | |
| 10,824,163 B2 * | 11/2020 | Einecke | G05D 1/0265 |
| 2004/0084634 A1 * | 5/2004 | Bechthold | H05H 7/08 |
| | | | 315/505 |
| 2005/0134204 A1 * | 6/2005 | Bechthold | H05H 7/04 |
| | | | 315/505 |
| 2011/0089321 A1 * | 4/2011 | Glavish | H01L 21/26566 |
| | | | 250/298 |
| 2015/0144810 A1 * | 5/2015 | Sinclair | H01J 37/3171 |
| | | | 250/505.1 |
| 2017/0169987 A1 * | 6/2017 | Lee | H01J 37/12 |
| 2018/0092197 A1 * | 3/2018 | Yamamoto | H05H 7/02 |
| 2018/0269033 A1 * | 9/2018 | Sinclair | H01J 37/3171 |
| 2019/0371562 A1 * | 12/2019 | Sinclair | H01J 37/05 |
| 2020/0066486 A1 * | 2/2020 | Sinclair | H01J 37/3007 |
| 2020/0234918 A1 * | 7/2020 | Sinclair | H01J 37/3007 |
| 2020/0357603 A1 * | 11/2020 | Sinclair | H01J 37/20 |
| 2022/0174810 A1 * | 6/2022 | Biloiu | H05H 7/22 |
| 2022/0183137 A1 * | 6/2022 | Sinclair | H05H 7/18 |
| 2022/0248523 A1 * | 8/2022 | Sinclair | H05H 7/02 |

* cited by examiner

RF QUADRUPOLE PARTICLE ACCELERATOR

FIELD OF THE DISCLOSURE

The disclosure relates generally to ion implantation apparatus and more particularly to high energy beamline ion implanters.

BACKGROUND OF THE DISCLOSURE

Ion implantation is a process of introducing dopants or impurities into a substrate via bombardment. Ion implantation systems may comprise an ion source and a series of beam-line components. The ion source may comprise a chamber where ions are generated. The ion source may also comprise a power source and an extraction electrode assembly disposed near the chamber. The beam-line components, may include, for example, a mass analyzer, a first acceleration or deceleration stage, a collimator, and a second acceleration or deceleration stage. Much like a series of optical lenses for manipulating a light beam, the beam-line components can filter, focus, and manipulate ions or ion beam having particular species, shape, energy, and/or other qualities. The ion beam passes through the beam-line components and may be directed toward a substrate mounted on a platen or clamp.

Implantation apparatus capable of generating ion energies of approximately 1 MeV or greater are often referred to as high energy ion implanters, or high energy ion implantation systems. One type of high energy ion implanter is termed linear accelerator, or LINAC, where a series of electrodes arranged as tubes conduct and accelerate the ion beam to increasingly higher energy along the succession of tubes, where the electrodes receive an powered voltage signal. Known LINACs are driven by an RF voltage of frequency in the 13.56 MHz-120 MHz range.

One issue for operation of RF LINAC ion implanters is that during acceleration of an ion beam, which ion beam is partitioned into ion bunches along a direction of propagation (Z-direction), a natural tendency of an ion bunch is to spread out both transversely (in X-direction and Y-direction) as well as longitudinally (in Z-direction, or equivalently, in time). Known methods for focusing ions are generally complex and may require unduly lengthy acceleration stages to focus the accelerating ion bunches.

In some approaches, transverse focusing of ions may be performed adding DC quadrupoles. These DC quadrupoles may be added at various stages along a LINAC, which stages include drift tube electrodes that are used to accelerate the ion bunches. Such DC quadrupoles may be fabricated as electrostatic or magnetic components that apply a DC quadrupole field to a passing ion beam. The addition of these DC quadrupoles to a LINAC inevitably add cost, size and complexity to the beamline and the associated control systems.

With respect to these and other considerations the present disclosure is provided.

BRIEF SUMMARY

In one embodiment, an apparatus is provided. The apparatus may include a drift tube assembly, the drift tube assembly defining a triple gap configuration, and arranged to accelerate and transmit an ion beam along abeam path. The apparatus may include a resonator, to output an RF signal to the drift tube assembly, and an RF quadrupole triplet, connected to the drift tube assembly, and arranged circumferentially around the beam path.

In another embodiment, an ion implanter may include an ion source, to generate a continuous ion beam, and a buncher, disposed downstream of the ion source, and arranged to transform the continuous ion beam into a bunched ion beam. The ion implanter may include a linear accelerator, downstream of the buncher and comprising a plurality of accelerations stages. A given stage of the plurality of acceleration stages may include a drift tube assembly, the drift tube assembly comprising a plurality of drift tubes, defining a triple gap configuration, and arranged to accelerate the bunched ion beam along a beam path. The given stage may include a resonator, to output an RF signal to the drift tube assembly; and an RF quadrupole triplet, connected to the drift tube assembly, and arranged circumferentially around the beam path.

In a further embodiment, an apparatus may include a drift tube assembly, including a plurality of drift tubes arranged to accelerate and transmit an ion beam along a beam path. The apparatus may include a resonator, to output an RF signal to the drift tube assembly, and a quadrupole arrangement, arranged circumferentially around the beam path. The quadrupole arrangement may be integrated into a surface of the plurality of drift tubes of the drift tube assembly, and wherein the quadrupole arrangement defines a sinusoidal shape or an elliptical shape.

Figure 1:
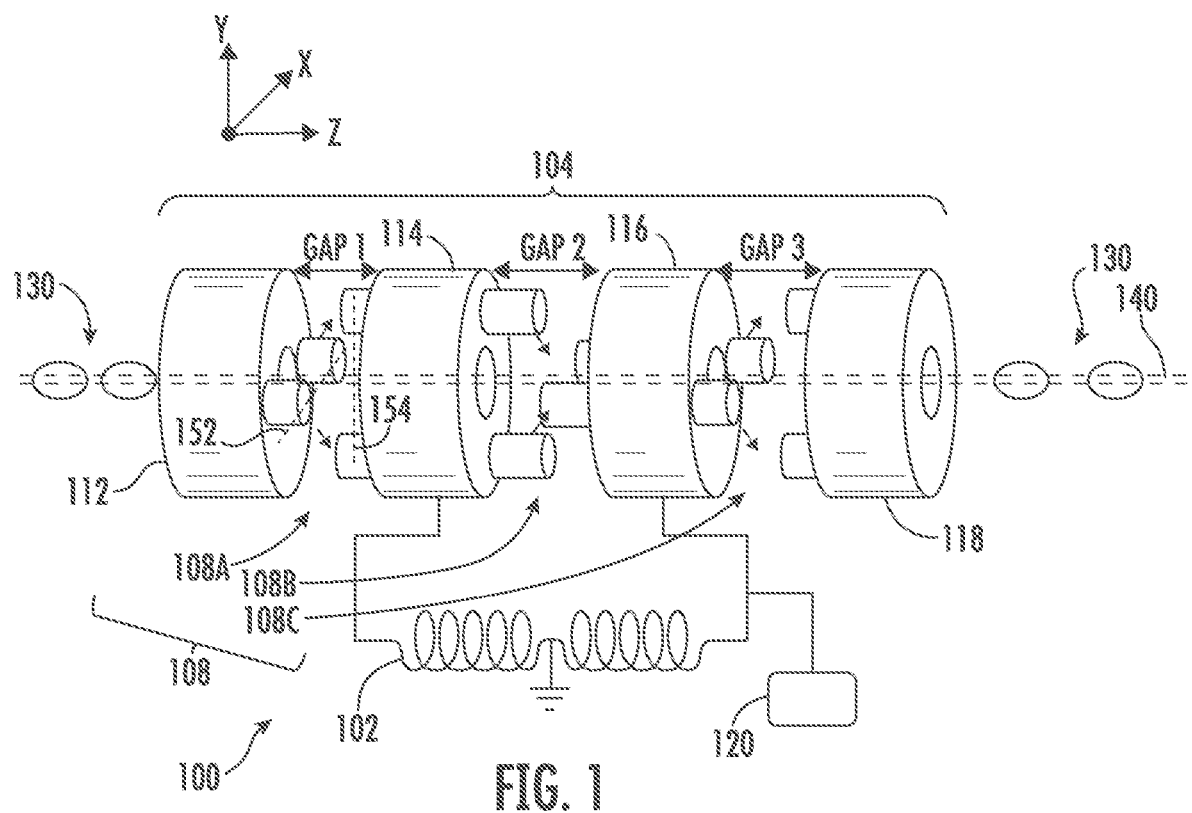
FIG. 1 shows an exemplary apparatus according to embodiments of the disclosure.

The drawings are not necessarily to scale. The drawings are merely representations, not intended to portray specific parameters of the disclosure. The drawings are intended to depict exemplary embodiments of the disclosure, and therefore are not be considered as limiting in scope. In the drawings, like numbering represents like elements.

DETAILED DESCRIPTION

An apparatus, system and method in accordance with the present disclosure will now be described more fully hereinafter with reference to the accompanying drawings, where embodiments of the system and method are shown. The system and method may be embodied in many different forms and are not be construed as being limited to the embodiments set forth herein. Instead, these embodiments are provided so this disclosure will be thorough and complete, and will fully convey the scope of the system and method to those skilled in the art.

Terms such as "top," "bottom," "upper," "lower," "vertical," "horizontal," "lateral," and "longitudinal" may be used herein to describe the relative placement and orientation of these components and their constituent parts, with respect to the geometry and orientation of a component of a semiconductor manufacturing device as appearing in the figures. The terminology may include the words specifically mentioned, derivatives thereof, and words of similar import.

As used herein, an element or operation recited in the singular and proceeded with the word "a" or "an" are understood as potentially including plural elements or operations as well. Furthermore, references to "one embodiment" of the present disclosure are not intended to be interpreted as precluding the existence of additional embodiments also incorporating the recited features.

Provided herein are approaches for improved high energy ion implantation systems and components, based upon a beamline architecture, and in particular, ion implanters based upon linear accelerators. For brevity, an ion implantation system may also be referred to herein as an "ion implanter." Various embodiments entail novel approaches that provide the capability of improved control of an ion beam during acceleration through the acceleration stages of a linear accelerator, and in particular, improved ion beam focusing.

FIG. 1 shows an exemplary apparatus according to embodiments of the disclosure. The apparatus 100 may represent an acceleration stage of a linear accelerator, such as a linear accelerator arranged within an ion implanter, as discussed below with respect to FIG. 8. The apparatus 100 includes a drift tube assembly 104 and associated components for accelerating an ion beam in an acceleration stage of a linear accelerator. In particular, the apparatus 100 defines a triple gap configuration, where an ion beam is conducted through three accelerating gaps within the apparatus 100. As such, the apparatus 100 is arranged to transmit and accelerate a bunched ion beam, shown as an ion beam 130, along a beam path 140, extending along a central region of the apparatus 100.

The drift tube assembly 104 is formed of a plurality of drift tubes, including a first grounded drift tube 112, a second grounded drift tube 118, a first powered drift tube 114, disposed downstream of the first grounded drift tube 112, and a second powered drift tube 116, disposed downstream of the first powered drift tube 114. The drift tube assembly 104 is coupled to a resonator 102, arranged to output an RF signal. In the configuration of FIG. 1, opposite ends of the resonator 102 are connected to the first powered drift tube 114, and the second powered drift tube 116. Accordingly, when an RF power generator 120 delivers RF power to the resonator 102, an RF voltage of a first polarity is generated on the first powered drift tube 114, while a RF voltage of a second, opposite, polarity is generated on the second powered drift tube 116. The generated RF voltages have sinusoidal temporal variation and have phase difference of 180 degrees, which variation means the voltage on the first powered drift tube 114 is equal but opposite polarity as the voltage on the second powered drift tube 116. A sinusoidal time-varying electric field thus develops across gap 2, proportional to twice the instantaneous value of the RF voltage signal, and varying according to the frequency of the applied RF voltage signal. Likewise, but having different amplitudes time-varying electric fields of the same frequency develops across gap 1, between the first grounded drift tube 112 and first powered drift tube 114, and across the gap 3, between the second powered drift tube 116 and second grounded drift tube 118.

Note that the apparatus 100 is arranged to accept the ion beam 130 as a bunched ion beam, where the ion beam 130 may be a continuous ion beam, upstream to the apparatus 100, and may be bunched by a buncher (not shown), arranged according to known LINACs. As such, by properly arranging the timing of the arrival of a bunch of ions of the ion beam 130 at the gap 1, gap 2, gap 3, the ion beam may be accelerated by electric fields that are created when the generated RF voltage on the powered electrodes reach a maximum value and has the right polarity, i.e., when the voltage drop across the gap is equal to minus the amplitude of the voltage for the gaps, gap1 and gap3 and minus two times the voltage amplitude for gap2. In this manner, a given bunch may be accelerated generally along the Z-axis of the Cartesian coordinate system shown. At the same time, the bunched ions may tend to defocus in the X-direction and Y-direction. To counteract this tendency, the apparatus 100 is equipped with a quadrupole arrangement 108, connected to the drift tube assembly 104, and arranged circumferentially around the beam path 140.

As shown, the quadrupole arrangement 108 is arranged as a triplet, the triplet including a first quadrupole 108A, formed on a downstream portion of the first grounded drift tube 112 and on an upstream portion of the first powered drift tube 114. The quadrupole arrangement 108 also includes a second quadrupole 108B, formed on a downstream portion of the first powered drift tube 114 and an upstream portion of the second powered drift tube 116. The quadrupole arrangement 108 further includes a third quadrupole 108C, formed on a downstream portion of the second powered drift tube 116 and on an upstream portion of the second grounded drift tube 118.

A given quadrupole of the quadrupole arrangement 108 includes two pairs of protrusions, where the protrusions of a given pair are arranged on opposite sides of the beam path 140, and connected to a given drift tube. To define a quadrupole geometry, the protrusions may be arranged the following manner: A first line (see line 152) extending through first protrusion pair is rotated 90 degrees about an axis generally defined by the beam path 140, with respect to a line extending through the second protrusion pair (see line 154). While shown as cylinders, the protrusions may be of any suitable shape according to other embodiments.

Note that the quadrupole arrangement 108 may be formed of conductive material that is electrically connected with the drift tube assembly 104, so the potential of a given quadrupole component of first quadrupole 108A, second quadrupole 108B, or third quadrupole 108C is maintained at the same potential as the potential of drift tube, connected to the given quadrupole component. Thus, the quadrupole arrangement 108 forms an RF quadrupole triplet that generates a time varying and alternating polarity quadrupole electric field at the same frequency as the accelerating electrical fields extending along the Z-direction across the gaps—gap 1, gap 2, and gap 3.

In operation, as the ion beam 130 is accelerated through the apparatus 100, and an RF voltage signal is applied to the drift tube assembly 104, the quadrupole arrangement 108 will introduce a quadrupole moment into each of the gaps, gap 1, gap 2, and gap 3, via first quadrupole 108A, second quadrupole 108B, and third quadrupole 108C. These quadrupoles may act to produce a classic balanced quadrupole triplet. According to some embodiments of the disclosure, the relative length (along the Z-direction) of the gaps gap 1, gap 2, and gap 3, as well as the quadrupole strength of the gaps may be adjusted independently of one another to achieve proper focusing of the ion beam 130. In this manner, the same focusing strength in X and Y directions may be achieved overall, with similar quadrupole strength fields in alternating directions, as indicated by the arrows in FIG. 1. This result may in particular be achieved by optimizing the size of the protrusions forming the respective quadrupoles on each side of gap1, gap 2 and gap 3.

Note that in the embodiment of FIG. 1, the cylindrical shapes of the protrusions forming the respective quadrupoles are not ideal, because such cylinders exhibit sharp corners. These sharp corners may not be suitable for stability in a high field environment, where a relatively higher electric field is generated across the gaps, gap1, gap 2, or gap3. Such sharp corners may produce field intensification and serve to initiate electrostatic breakdown, even in vacuum environments. Accordingly, in additional embodiments, a quadrupole may be formed using smoother, more rounded features.

Figure 2:
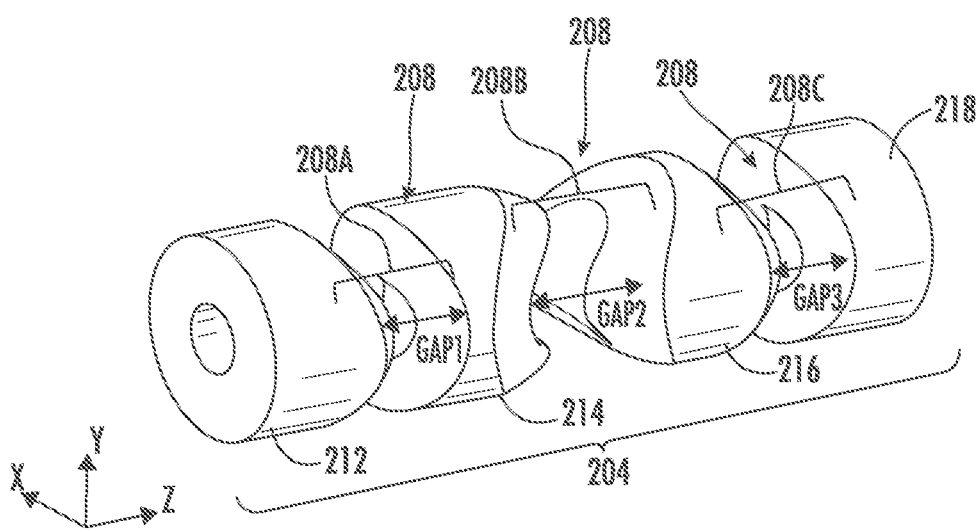
FIG. 2 shows another exemplary apparatus, according to embodiments of the disclosure.

FIG. 2 presents an embodiment showing a drift tube assembly 204 that may be used as in the case of drift tube assembly 104, to accelerate and shape an ion beam, generally as discussed with respect to FIG. 1. The drift tube assembly 204 is formed of a plurality of drift tubes, including a first grounded drift tube 212, a second grounded drift tube 218, a first powered drift tube 214, disposed downstream of the first grounded drift tube 212, and a second powered drift tube 216, disposed downstream of the first powered drift tube 214. In this embodiment, a quadrupole arrangement 208 is formed integrally with the drift tube assembly 204, where the quadrupole arrangement 208 is specifically formed by shaping portions of the various drift tubes of the drift tube assembly 204.

More particularly, the quadrupole arrangement 208 is arranged as a triplet, the triplet including a first quadrupole 208A, formed on a downstream portion of the first grounded drift tube 212 and on an upstream portion of the first powered drift tube 214. The quadrupole arrangement 208 also includes a second quadrupole 108B, formed on a downstream portion of the first powered drift tube 214 and an upstream portion of the second powered drift tube 216. The quadrupole arrangement 208 further includes a third quadrupole 208C, formed on a downstream portion of the second powered drift tube 216 and on an upstream portion of the second grounded drift tube 218. Like the quadrupole arrangement 108, the quadrupole arrangement 208 may act to focus an ion beam (not shown) in X- and Y-directions, while the ion beam is conducted and accelerated along the Z-direction through the drift tube assembly 204.

In the embodiment of FIG. 2, the first quadrupole 208A, second quadrupole 208B, and third quadrupole 208C define a sinusoidal shape, as shown. According to some embodiments, the shapes of the various opposing drift tubes may form complementary matches to one another. In particular, a downstream surface of the first grounded drift tube 212 may form a complementary match to an upstream surface of the first powered drift tube 214. Likewise, a downstream surface of the first powered drift tube 214 may form a complementary match to an upstream surface of the second powered drift tube 216, while a downstream surface of the second powered drift tube 216 forms a complementary match to an upstream surface of the second grounded drift tube 218. Said differently, the opposing surfaces that form each quadrupole, if brought together, may fit one another as a three-dimensional jigsaw coupling.

Figure 3:
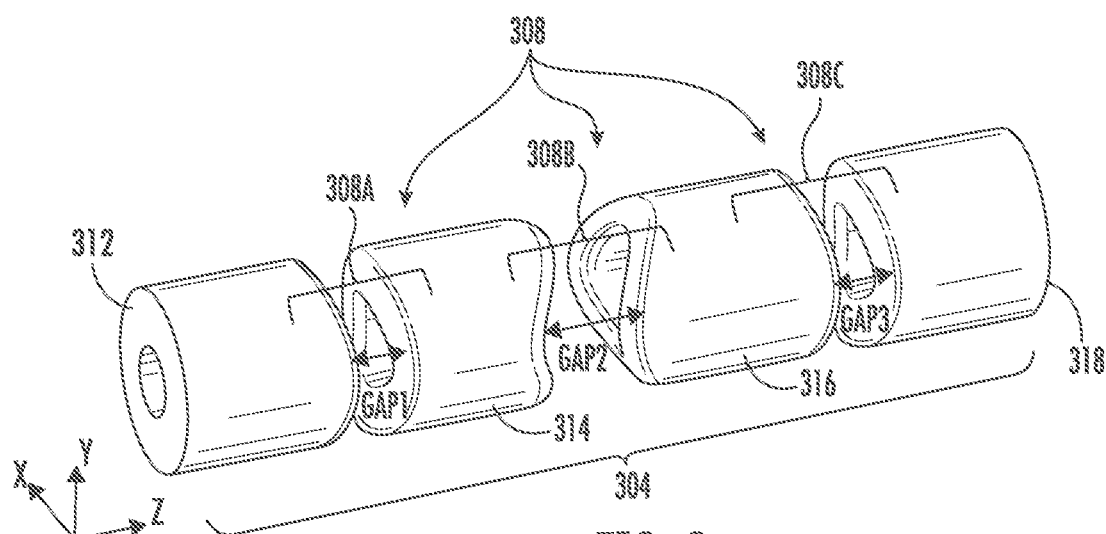
FIG. 3 shows a further exemplary apparatus, according to embodiments of the disclosure.

FIG. 3 presents an apparatus showing a drift tube assembly 304 that may be used in the manner of the drift tube assembly 104 or drift tube assembly 204, to accelerate and shape an ion beam, generally as discussed with respect to FIG. 1 and FIG. 2. The drift tube assembly 304 is formed of a plurality of drift tubes, including a first grounded drift tube 312, a second grounded drift tube 318, a first powered drift tube 314, disposed downstream of the first grounded drift tube 312, and a second powered drift tube 316, disposed downstream of the first powered drift tube 314. In this embodiment, a quadrupole configuration 308 is formed integrally with the drift tube assembly 304, where the quadrupole configuration 308 is formed from shaping portions of the various drift tubes of the drift tube assembly 304. The drift tube assembly 304 may be arranged to operate similarly to the drift tube assembly 204, except that the shape of the quadrupole 308A, quadrupole 308B, and quadrupole 308C are defined by elliptical surfaces.

Figure 4:
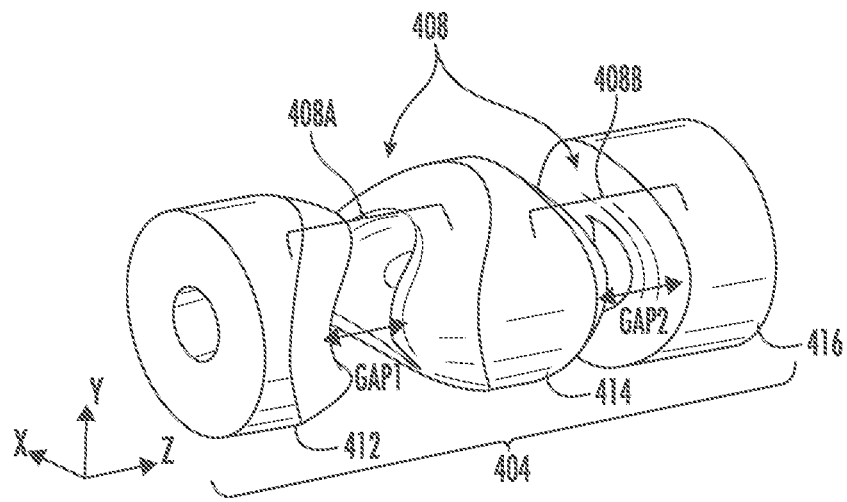
FIG. 4 illustrates yet another exemplary apparatus, according to additional embodiments of the disclosure.

FIG. 4 presents an apparatus showing a drift tube assembly 404 that may be used as in the drift tube assembly 104, drift tube assembly 204, and drift tube assembly 304, to accelerate and shape an ion beam, generally as discussed with respect to FIG. 1 and FIG. 2. A difference in this embodiment and previous embodiments is that the drift tube assembly 404 defines a double gap configuration, shown as gap 1 and gap 2. The drift tube assembly 404 is formed of a plurality of drift tubes, including a first grounded drift tube 412, a second grounded drift tube 416, and a powered drift tube 414, disposed downstream between the first grounded drift tube 312 and the second grounded drift tube 416. This drift tube assembly 404 may be coupled to receive an RF voltage from a single end of a resonator as in known LINAC double gap configurations. Advantageously, a quadrupole arrangement 408 is formed integrally within the various drift tubes and is defined by a first quadrupole 408A and second quadrupole 408B, defined by sinusoidal shapes as in the embodiment of FIG. 2, to provide better X- and Y-focusing of an ion beam.

Figure 5:
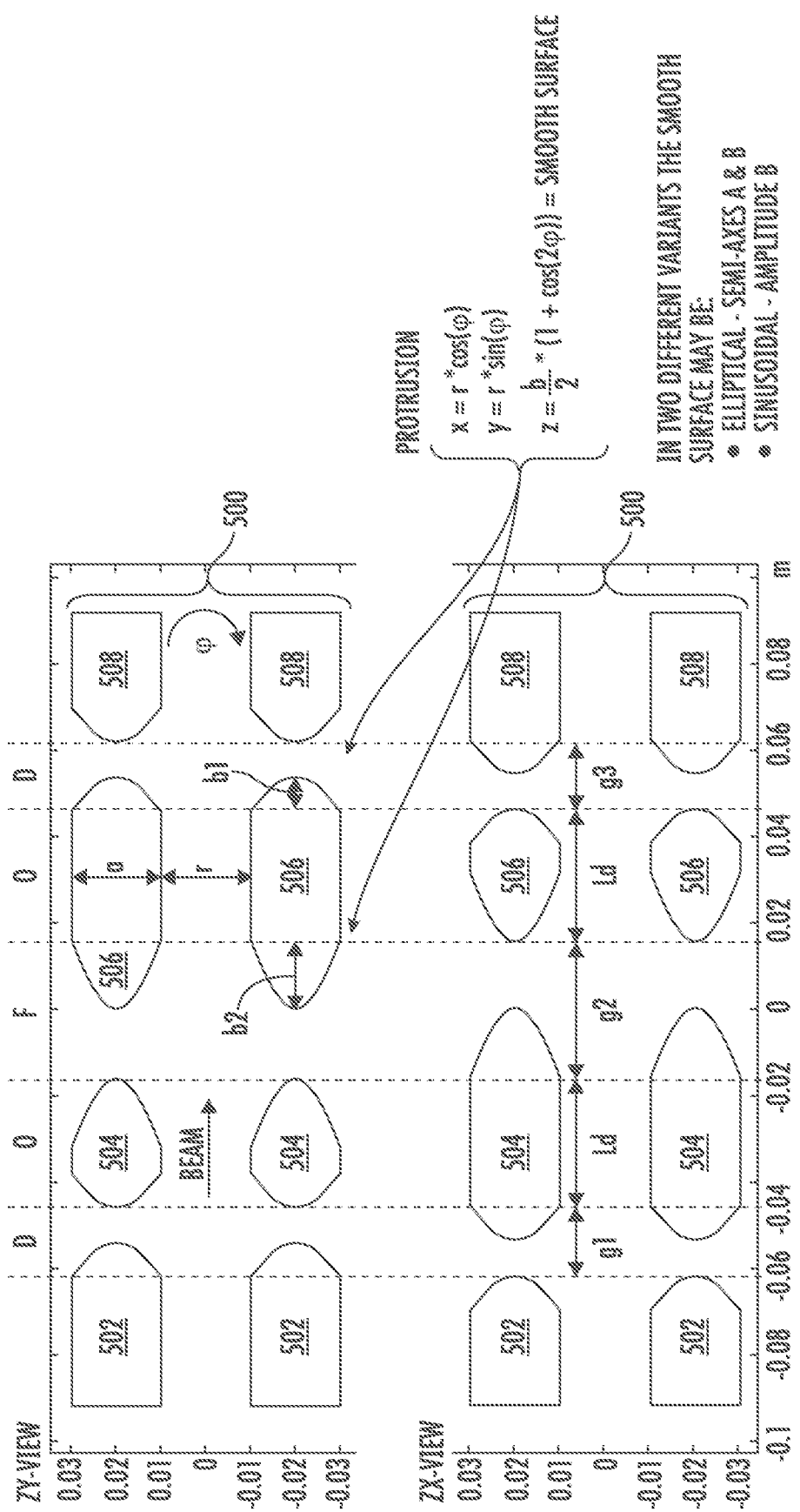
FIG. 5 shows details of the geometry of an apparatus, according to embodiments of the disclosure.

FIG. 5 shows details of the geometry of drift tube apparatus, with a quadrupole arrangement formed integrally therein, according to embodiments of the disclosure. In particular, a section through the Z-X plane and a section through the Z-Y plane are shown. The drift tube apparatus is shown as a drift tube assembly 500, including four electrodes as generally described above, namely, a first grounded drift tube 502, first powered drift tube 504, second powered drift tube 506, and second grounded drift tube 508. The electrodes (drift tubes) are modeled as cylindrical shells of thickness of 2*a, which value is 20 mm in the non-limiting embodiment of FIG. 5. In each section, the cross sectional view of a cylindrical shell shows two identical sets of structures. FIG. 5 also provides exemplary equations for defining the surfaces of the electrodes for elliptical or sinusoidal embodiments. In particular, in this non-limiting embodiment, to ensure a smooth transition, the parameter "a" may represent the value for one semi-axis of an ellipse, as well as half the thickness (2a) of the cylindrical shell of the drift tube electrode. The parameter "a" alternatively represents the value of a quarter wavelength in the embodiment of a sinusoidal surface. In the case of an elliptical surface, the value of "b" is independent of the radius "r" and may be varied to generate small/medium/large protrusions that define quadrupole structures. The physical limit of "b" is the gap length for a given gap in a drift tube assembly.

Figure 6A:
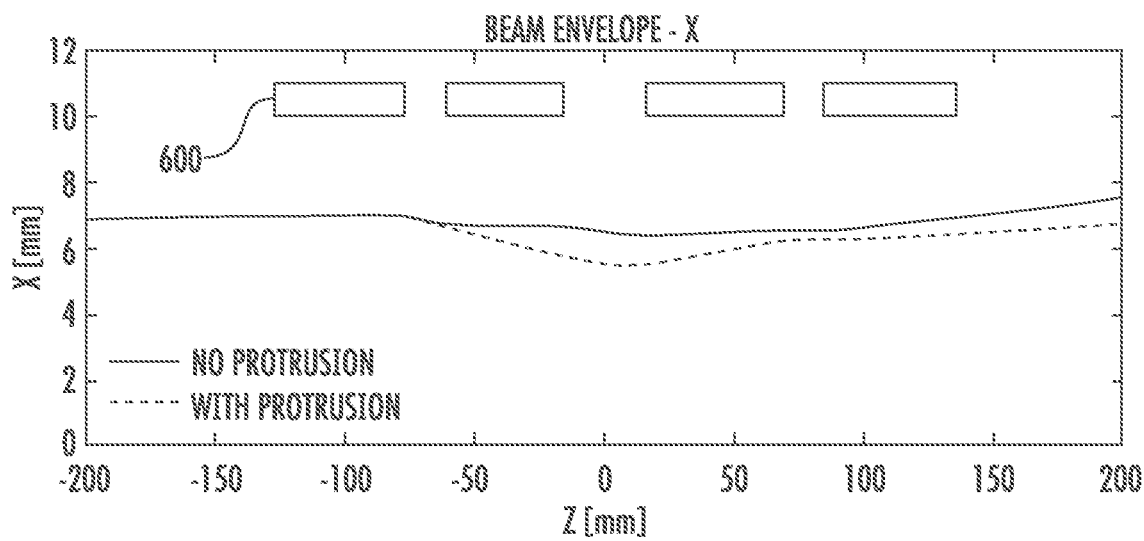
FIG. 6A and FIG. 6B depict the geometry of ion beam focusing in accordance with embodiments of the disclosure.
Figure 6B:
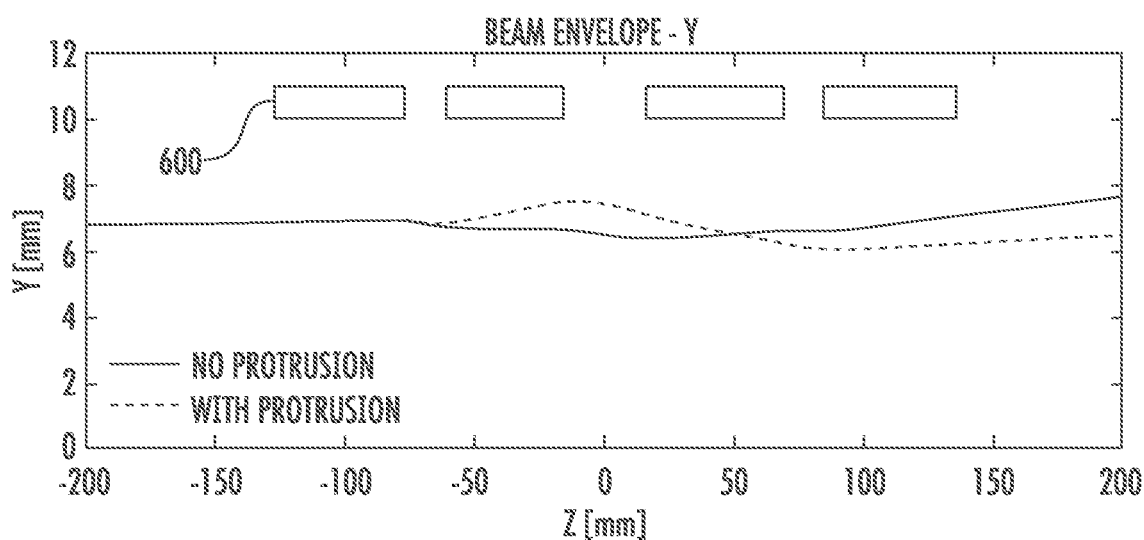

FIG. 6A and FIG. 6B depict the geometry of ion beam focusing in accordance with embodiments of the disclosure. In particular, FIG. 6A and FIG. 6B are plots for the beam envelope of an ion beam in the X-Z plane and the Y-Z plane, respectively, developed from a simulation study where P++ ions are tracked under an example of defocusing-focusing-defocusing (DOFODO) configuration drift tube configuration 600 with quadrupoles (see FIG. 5). The plots illustrate that, under no space charge force, a circular beam can be focused on both of two transverse directions by carefully choosing an RF phase (plot for no protrusion). With inclusion of a protrusion, one can clearly observe that for the x-direction the beam undergoes focusing, then defocusing, and then focusing (FODOFO), while for the y-direction the beam undergoes defocusing, then focusing, and then defocusing (DOFODO). At the end of the triplet, overall and balanced focusing effect is achieved toward the exit (see lower curves at Z=200 mm).

In other embodiments of the disclosure, a drift tube assembly may be arranged with quadrupoles, wherein at least one gap may be adjustable. Because the quadrupole strength will depend on the length of the gap, and the length and the size of the protrusions forming the quadrupole, the ability to adjust gap length allows quadrupole strength to be adjusted without having to remove or reconfigure parts of a drift tube assembly.

Figure 7A:
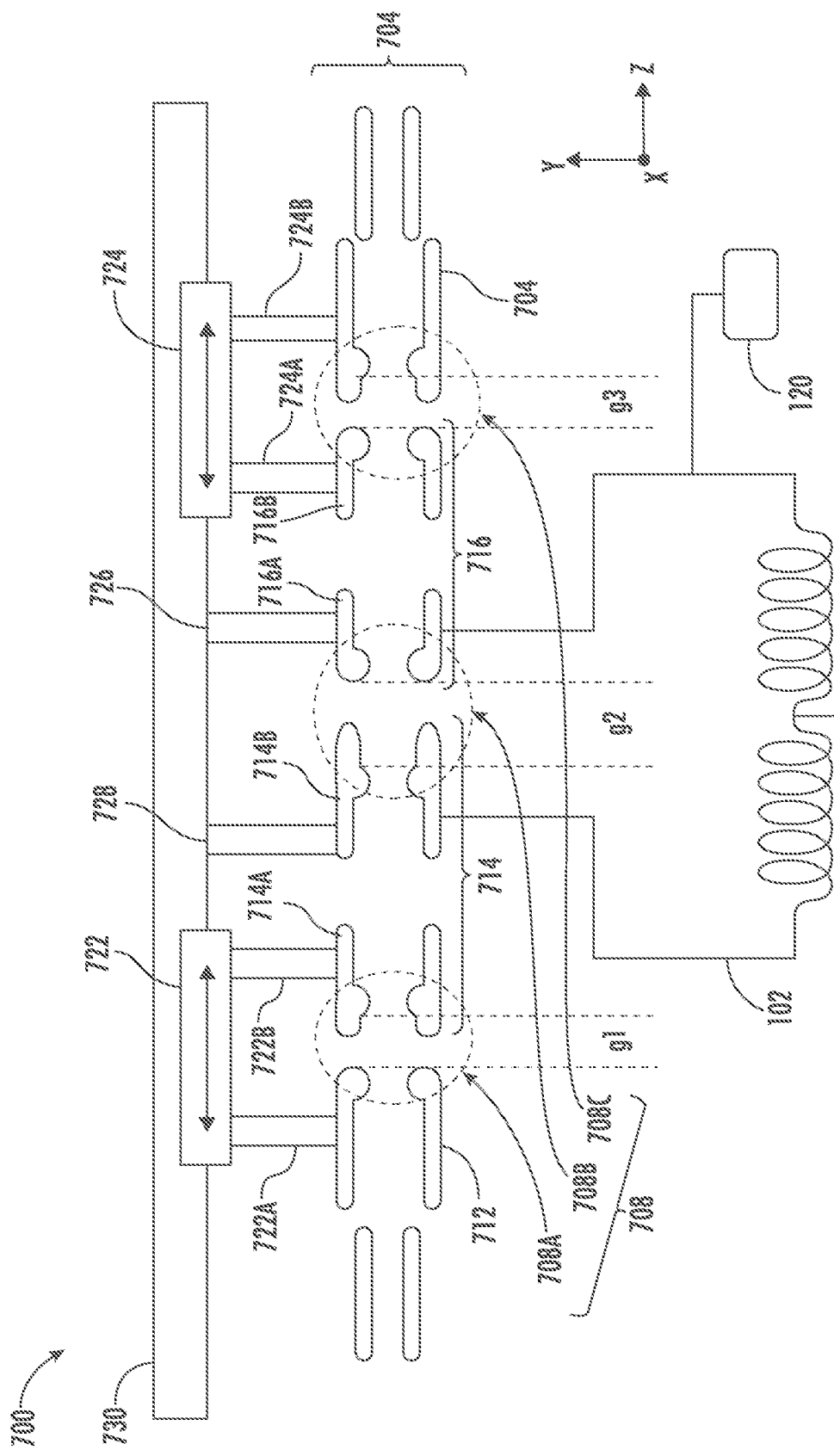
FIG. 7A shows another exemplary apparatus, according to further embodiments of the disclosure.

FIG. 7A shows another exemplary apparatus, according to further embodiments of the disclosure. In the apparatus 700, a resonator 102 and RF power generator 120, previously discussed, are shown, and will not be described further. In this apparatus, a drift tube assembly 704 defines a triple gap configuration, shown as g1, g2, and g3.

The apparatus 700 includes a cross structure 730, and support structure 722, arm 728, arm 726, and support structure 724, all being mechanically coupled to the cross structure 730. The support structure 722 includes a first arm 722A and a second arm 722B. The first arm 722A is mechanically coupled to a first ground drift tube 712, while the second arm 722B is mechanically coupled to a first part 714-A of a first powered drift tube couple 714.

The support structure 724C includes a first arm 724A and a second arm 724B. The first arm 724A is mechanically coupled to a second part 716-B of a second powered drift tube couple 716, while the second arm 724B is mechanically coupled to a second ground drift tube 718.

The fixed arm 728 is connected to the second part 714-B of the first powered drift tube couple 714. The fixed arm 726 is connected to the first part 716-A of the second powered drift tube couple 716.

A quadrupole triplet 708 is formed, including quadrupole 708A, quadrupole 708B, and quadrupole 708C, formed in the gaps g1, g2, and g3, respectively. In accordance with some embodiments of the disclosure, arm 728, arm 726, first arm 722A, second arm 722B, first arm 724A and second arm 724B may be independently movable along the Z-axis with respect to one another, which movement enables the change of g1, g2, and g3 independently. This adjustment of the size of g1, g2, and g3 may be accomplished by any suitable means for moving the aforementioned arms, such as external mechanical components, motors, or other components (not shown), while not requiring breaking of vacuum in the beamline or replacement of drift tube components.

By providing an arrangement where the size of gaps g1, g2, and g3 may be readily varied, the embodiment of FIG. 7A provides a novel approach to controlling beam geometry. While the size of the protuberance for the quadrupoles may be fixed, as defined by the hardware that forms a given drift tube/quadrupole assembly (such as drift tube assembly 704), the present inventors have discovered that the focusing strength provided by a given protuberance may be adjusted by changing the size of g1, g2, and g3. In other words, the size (along the Z-direction) of one or more of the gaps may be independently adjusted to adjust the focusing strength for an ion beam.

Figure 7B:
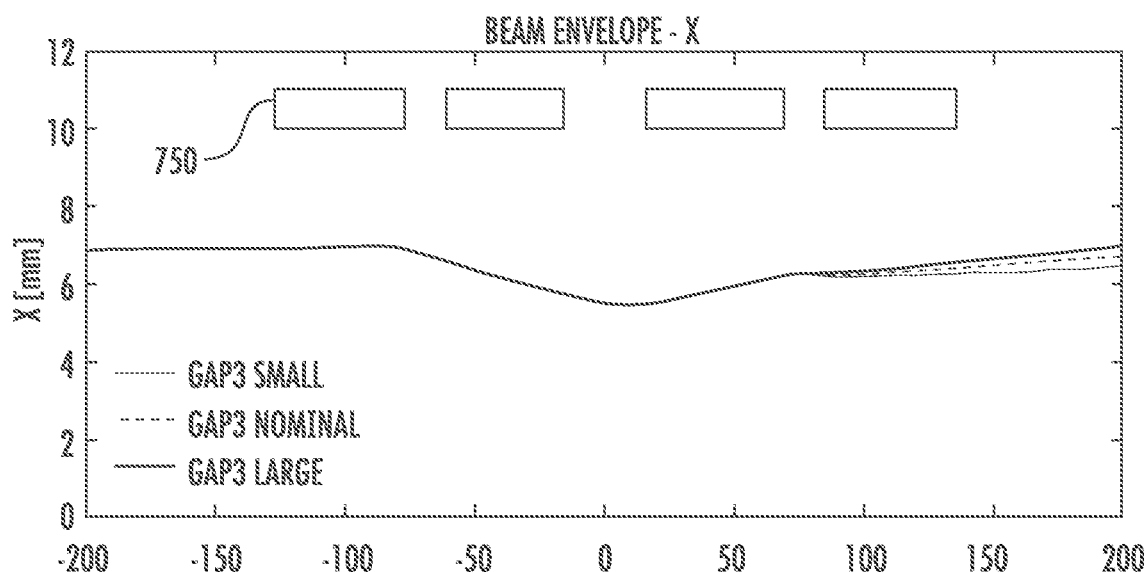
FIG. 7B and FIG. 7C present simulation results showing ion beam focusing as a function of gap dimensions is an apparatus arranged according to embodiments of the disclosure.
Figure 7C:
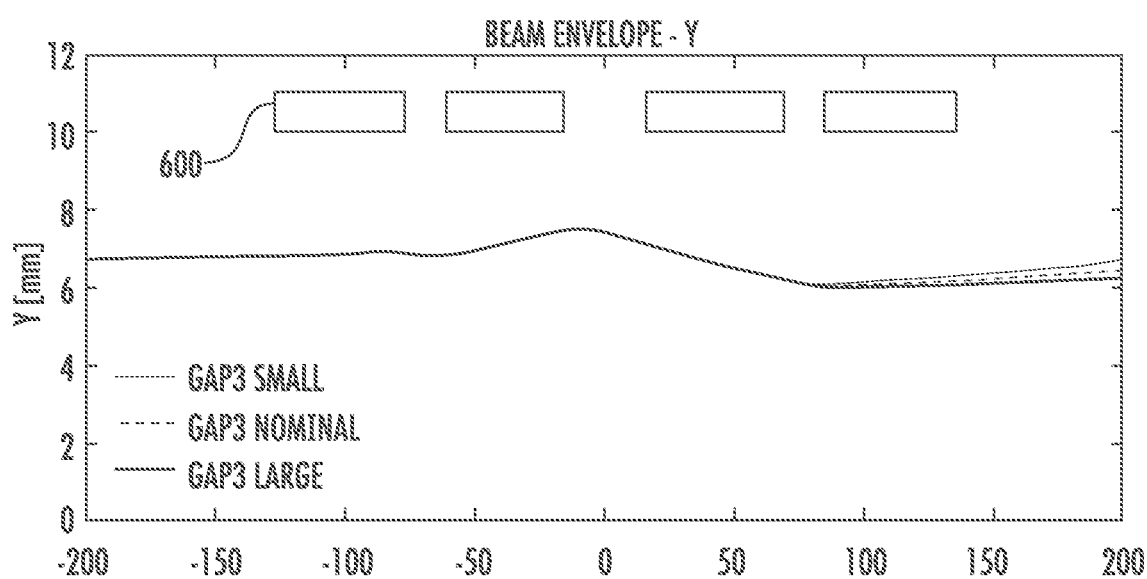

FIG. 7B and FIG. 7C shows an example where the effect of changing the size of one accelerating gap is shown, such as changing g3. The simulation shown illustrates that, by changing Lq3, the focusing strength generated by a drift tube/quadrupole assembly changes, resulting in a change in beam size. In particular, FIGS. 7B and FIG. 7C are plots for the beam envelope of an ion beam in the X-Z plane and the Y-Z plane, respectively, developed from a simulation study where a simple drift tube assembly 750 is schematically represented by four different blocks, where the rightmost two blocks define a gaps g3. In the simulation shown, the relative size of the gap g3 is adjusted while the other gap dimensions remain fixed. For the particular ion beam conditions shown, reducing the size of g3 results in decreasing beam width in X (at 200 mm), while increasing the beam width in Y. For other ion beam conditions, different mass-to-charge ratio might lead to different transit time and other higher order effects, the subsequent beam focusing behavior may differ from those results shown in FIG. 6A and FIG. 6B. Notably, the above results illustrate the ability to vary beam focus by adjusting the size of just one gap, while in additional embodiments, the ability to independently vary the size more than one gap will provide additional beam focusing control.

Figure 8:
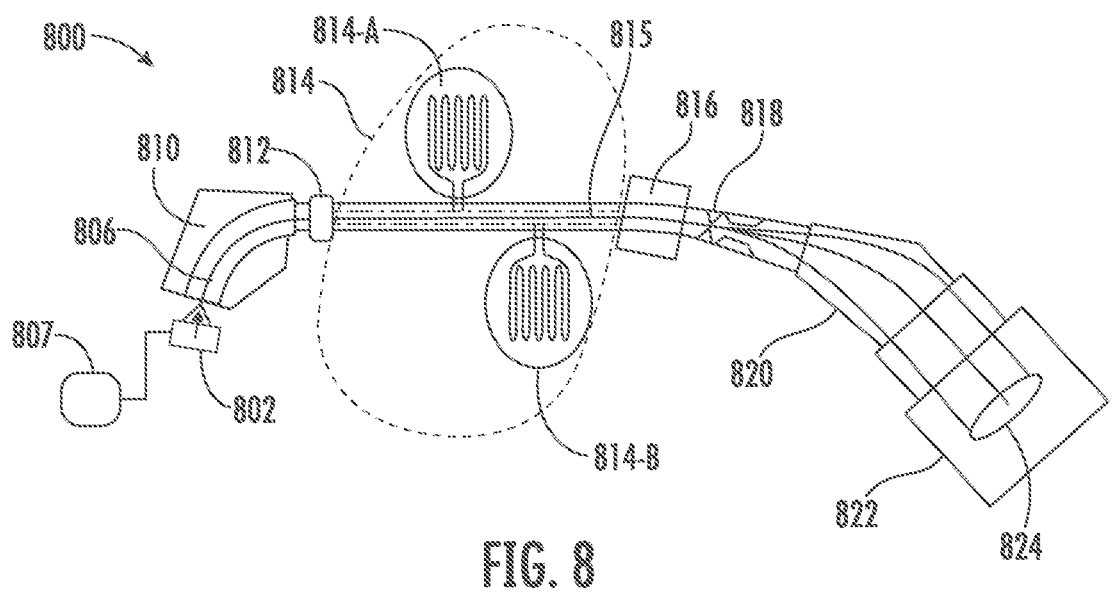
FIG. 8 depicts an exemplary ion implanter according to embodiments of the disclosure.

FIG. 8 depicts a schematic of an ion implanter, according to embodiments of the disclosure. The ion implanter 800 includes acceleration stages 814-A, 814-B of a LINAC, shown as linear accelerator 814. The ion implanter 800, may represent a beamline ion implanter, with some elements not shown for clarity of explanation. The ion implanter 800 may include an ion source 802, and a gas box 807 as known in the art. The ion source 802 may include an extraction system including extraction components and filters (not shown) to generate an ion beam 806 at a first energy. Examples of suitable ion energy for the first ion energy range from 5 keV to 100 keV, while the embodiments are not limited in this context. To form a high energy ion beam, the ion implanter 800 includes various additional components for accelerating the ion beam 806.

The ion implanter 800 may include an analyzer 810, functioning to analyze the ion beam 806 as in known apparatus, by changing the trajectory of the ion beam 806, as shown. The ion implanter 800 may also include a buncher 812, and a linear accelerator 814 (shown in the dashed line), disposed downstream of the buncher 812, where the linear accelerator 814 is arranged to accelerate the ion beam 806 to form a high energy ion beam 815, greater than the ion energy of the ion beam 806, before entering the linear accelerator 814. The buncher 812 may receive the ion beam 806 as a continuous ion beam and output the ion beam 806 as a bunched ion beam to the linear accelerator 814. The linear accelerator 814 may include a plurality of acceleration stages (814-A, 814-B, . . . to 814-Z (not shown)), arranged in series, as shown. In various embodiments, the ion energy of the high energy ion beam 815 may represent the final ion energy for the ion beam 806, or approximately the final ion energy. In various embodiments, the ion implanter 800 may include additional components, such as filter magnet 816, a scanner 818, collimator 820, where the general functions of the scanner 818 and collimator 820 are well known and will not be described herein in further detail. As such, a high energy ion beam, represented by the high energy ion beam 815, may be delivered to an end station 822 for processing a substrate 824. Non-limiting energy ranges for the high energy ion beam 815 include 500 keV-10 MeV, where the ion energy of the ion beam 806 is increased in steps through the various acceleration stages of the linear accelerator 814. In accordance with various embodiments of the disclosure, one or more of the acceleration stages of the linear accelerator 814 may include a drift tube assembly, with integrated quadrupole arrangement, as detailed with respect to the embodiments of FIGS. 1-7. An advantage provided by the ion implanter 800 is that the focusing of the ion beam 815 as conducted through the linear accelerator 814 may be improved, due to the operation of the integrated quadrupole configurations.

In view of the above, the present disclosure provides at least the following advantages. As a first advantage, the integration of a quadrupole triplet into a drift tube assembly provides the ability to independently control focus of ion beam bunches. A second advantage is that the provision of variable length drift tube assembly of the present embodiments provides the flexibility to independently control quadrupole strength.

While certain embodiments of the disclosure have been described herein, the disclosure is not limited thereto, as the disclosure is as broad in scope as the art will allow and the specification may be read likewise. Therefore, the above description are not to be construed as limiting. Those skilled in the art will envision other modifications within the scope and spirit of the claims appended hereto.

The invention claimed is:

1. An apparatus, comprising:
a drift tube assembly, the drift tube assembly comprising a plurality of drift tubes that define a triple gap configuration, and are arranged to accelerate and transmit an ion beam along a beam path;
a resonator, to output an RF signal to the drift tube assembly; and
an RF quadrupole triplet, connected to the drift tube assembly, and arranged circumferentially around the beam path, the RF quadrupole triplet comprising:
a first quadrupole formed on a downstream portion of a first grounded drift tube and an upstream portion of a first powered drift tube;
a second quadrupole formed on a downstream portion of the first powered drift tube and an upstream portion of a second powered drift tube; and
a third quadrupole formed on a downstream portion of the second powered drift tube and an upstream portion of a second grounded drift tube,
wherein a downstream surface of the first grounded drift tube forms a complementary match to an upstream surface of the first powered drift tube, wherein a downstream surface of the first powered drift tube forms a complementary match to an upstream surface of the second powered drift tube, and wherein a downstream surface of the second powered drift tube forms a complementary match to an upstream surface of the second grounded drift tube.

2. The apparatus of claim 1, wherein the RF quadrupole triplet is integrally formed within the plurality of drift tubes.

3. The apparatus of claim 1, wherein the first quadrupole, the second quadrupole, and the third quadrupole define an elliptical shape.

4. The apparatus of claim 1, wherein the first quadrupole, the second quadrupole, and the third quadrupole define a sinusoidal shape.

5. The apparatus of claim 1, wherein the drift tube assembly comprises a first powered drift tube couple, and a second powered drift tube couple, wherein the triple gap configuration comprises a first gap, between the first grounded drift tube and first powered drift tube couple, a second gap, between first powered drift tube couple and the second powered drift tube couple, and a third gap, between the second powered drift tube couple and the second grounded drift tube, wherein a first length of the first powered drift tube is adjustable, and a second length of the second powered drift tube is adjustable.

6. The apparatus of claim 5, wherein a first part of the first powered drift tube couple and the first grounded drift tube are movable in concert with one another, wherein a second part of the second powered drift tube couple and the second grounded drift tube are movable in concert with one another, wherein the first gap, second gap, and third gap do not vary when a length of the first powered drift tube or a length of the second powered drift tube is varied.

7. An ion implanter, comprising:
an ion source, to generate a continuous ion beam;
a buncher, disposed downstream of the ion source, and arranged to transform the continuous ion beam into a bunched ion beam; and
a linear accelerator, downstream of the buncher and comprising a plurality of accelerations stages, wherein a given stage of the plurality of acceleration stages comprises:
a drift tube assembly, the drift tube assembly comprising a plurality of drift tubes, defining a triple gap configuration, and arranged to accelerate the bunched ion beam along a beam path;
a resonator, to output an RF signal to the drift tube assembly; and
an RF quadrupole triplet, connected to the drift tube assembly, and arranged circumferentially around the beam path, the RF quadrupole triplet comprising:
a first quadrupole formed on a downstream portion of a first grounded drift tube and an upstream portion of a first powered drift tube;
a second quadrupole formed on a downstream portion of the first powered drift tube and an upstream portion of a second powered drift tube; and
a third quadrupole formed on a downstream portion of the second powered drift tube and an upstream portion of a second grounded drift tube,
wherein a downstream surface of the first grounded drift tube forms a complementary match to an upstream surface of the first powered drift tube, wherein a downstream surface of the first powered drift tube forms a complementary match to an upstream surface of the second powered drift tube, and wherein a downstream surface of the second powered drift tube forms a complementary match to an upstream surface of the second grounded drift tube.

8. The ion implanter of claim 7, the RF quadrupole triplet being integrally formed within the plurality of drift tubes.

9. The ion implanter of claim 7, wherein the first quadrupole, the second quadrupole, and the third quadrupole define an elliptical shape.

10. The ion implanter of claim 7, wherein the first quadrupole, the second quadrupole, and the third quadrupole define a sinusoidal shape.

11. The ion implanter of claim 7, wherein the drift tube assembly comprises a first powered drift tube couple, and a second powered drift tube couple, wherein the triple gap configuration comprises a first gap, between the first grounded drift tube and first powered drift tube couple, a second gap, between first powered drift tube couple and the second powered drift tube couple, and a third gap, between the second powered drift tube couple and the second grounded drift tube, wherein a first length of the first powered drift tube is adjustable, and a second length of the second powered drift tube is adjustable.

12. The ion implanter of claim 11, wherein a first part of the first powered drift tube couple and the first grounded drift tube are movable in concert with one another, wherein a second part of the second powered drift tube couple and the second grounded drift tube are movable in concert with one another, wherein the first gap, second gap, and third gap do not vary when a length of the first powered drift tube or a length of the second powered drift tube is varied.

13. An apparatus, comprising:
a drift tube assembly, the drift tube assembly comprising a plurality of drift tubes arranged to accelerate and transmit an ion beam along a beam path;
a resonator, to output an RF signal to the drift tube assembly; and
a quadrupole arrangement, arranged circumferentially around the beam path, wherein the quadrupole arrangement is integrated into a surface of the plurality of drift tubes of the drift tube assembly, and wherein the quadrupole arrangement defines a sinusoidal shape or an elliptical shape.

14. The apparatus of claim 13, wherein the drift tube assembly defines a triple gap configuration, and wherein the quadrupole arrangement defines an RF quadrupole triplet.

15. The apparatus of claim 14, wherein the drift tube assembly comprises a first powered drift tube couple, and a second powered drift tube couple, wherein the triple gap configuration comprises a first gap, between a first grounded drift tube and first powered drift tube couple, a second gap, between first powered drift tube couple and the second powered drift tube couple, and a third gap, between the second powered drift tube couple and a second grounded drift tube, wherein a first length of the first powered drift tube is adjustable, and a second length of the second powered drift tube is adjustable.

16. The apparatus of claim 13, wherein the drift tube assembly defines a double gap configuration.

* * * * *